(12) United States Patent
Hussell (10) Patent No.: US 10,964,866 B2
(45) Date of Patent: Mar. 30, 2021

(54) LED DEVICE, SYSTEM, AND METHOD WITH ADAPTIVE PATTERNS

(71) Applicant: Cree, Inc., Durham, NC (US)

(72) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/107,030

(22) Filed: Aug. 21, 2018

(65) Prior Publication Data

US 2020/0066952 A1 Feb. 27, 2020

(51) Int. Cl.
| | | |
|---|---|---|
| G06T 7/70 | (2017.01) |
| H01L 21/77 | (2017.01) |
| H01L 33/62 | (2010.01) |
| H04N 5/225 | (2006.01) |
| H01L 33/52 | (2010.01) |

(52) U.S. Cl.
CPC ............. H01L 33/62 (2013.01); G06T 7/70 (2017.01); H01L 21/77 (2013.01); H01L 33/52 (2013.01); H04N 5/2256 (2013.01)

(58) Field of Classification Search
None
See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,757,956 A * | 5/1998 | Koljonen .......... G06T 7/74 348/94 |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz |
| 6,791,119 B2 | 9/2004 | Slater et al. |
| 6,853,010 B2 | 2/2005 | Slater et al. |
| 6,958,497 B2 | 10/2005 | Emerson et al. |
| 7,095,056 B2 | 8/2006 | Vitta et al. |
| 7,213,940 B1 | 5/2007 | Van de Ven et al. |
| 7,456,499 B2 | 11/2008 | Loh et al. |

(Continued)

*Primary Examiner* — Jay C Chang
(74) *Attorney, Agent, or Firm* — Jenkins, Wilson, Taylor & Hunt, P.A.

(57) ABSTRACT

An adaptive electrical routing system for constructing an LED device. The system takes into account placement errors and tolerance regions for connection of one or more LEDs on a substrate. An optical device captures an image (e.g., comprising positional data of components of the LED device) of the LED device showing the actual placement of LEDs on the substrate and transfers the image to an analysis program. A customized pattern (e.g., a customized electrical routing pattern) can be created in one of several possible ways.

12 Claims, 7 Drawing Sheets

(56) References Cited

U.S. PATENT DOCUMENTS

| | | |
|---|---|---|
| 7,564,180 B2 | 7/2009 | Brandes |
| 8,729,589 B2 | 5/2014 | Hussell et al. |
| 8,866,410 B2 | 10/2014 | Negley et al. |
| 8,970,131 B2 | 3/2015 | Brandes et al. |
| 9,131,561 B2 | 9/2015 | Athayle |
| 9,277,605 B2 | 3/2016 | Ni |
| 9,414,454 B2 | 8/2016 | Brandes et al. |
| 9,713,211 B2 | 7/2017 | Van de Ven et al. |
| 2006/0221272 A1 | 10/2006 | Negley et al. |
| 2007/0104828 A1 | 5/2007 | Fornaguera |
| 2007/0139923 A1 | 6/2007 | Negley et al. |
| 2007/0158668 A1 | 7/2007 | Tarsa et al. |
| 2007/0170447 A1 | 7/2007 | Negley et al. |
| 2007/0223219 A1 | 9/2007 | Medendorp et al. |
| 2007/0253209 A1 | 11/2007 | Loh et al. |
| 2008/0012036 A1 | 1/2008 | Loh et al. |
| 2008/0121921 A1 | 5/2008 | Loh et al. |
| 2008/0173884 A1 | 7/2008 | Chitnis et al. |
| 2008/0179611 A1 | 7/2008 | Chitnis et al. |
| 2008/0198112 A1 | 8/2008 | Roberts |
| 2008/0308825 A1 | 12/2008 | Chakraborty et al. |
| 2009/0050907 A1 | 2/2009 | Yuan et al. |
| 2009/0050908 A1 | 2/2009 | Yuan et al. |
| 2009/0080185 A1 | 3/2009 | McMillan |
| 2009/0160363 A1 | 6/2009 | Negley et al. |
| 2009/0184616 A1 | 7/2009 | Van de Ven et al. |
| 2010/0018956 A1* | 1/2010 | Watts ............... H01L 21/76894 219/121.72 |
| 2012/0132937 A1* | 5/2012 | Chan ............... H01L 25/0753 257/89 |
| 2012/0305956 A1* | 12/2012 | Liu ............... H01L 33/0095 257/98 |
| 2015/0257211 A1 | 9/2015 | Johnson et al. |

\* cited by examiner

LED DEVICE, SYSTEM, AND METHOD WITH ADAPTIVE PATTERNS

TECHNICAL FIELD

The present subject matter relates generally to light emitting devices, systems, and/or methods. More particularly, the subject matter disclosed herein relates to circuitry for mounting LEDs to a substrate.

BACKGROUND

In some aspects of LED apparatus design, there is an evolution toward reducing the size and/or increasing the number of LED devices in an apparatus. For example, video screens can use a large number of LED devices, and reducing the size of the individual pixels of LEDs can in some cases improve the perceived quality of the light output. As more LED components or packages are added to a particular apparatus, the time required to build the given device can potentially increase, as well as the production cost. Accordingly, there are ongoing efforts to reduce the amount of time needed to perform various processing steps, such as placement, electrical routing, coating applications, etc.

One particular area of concern with high-volume processing of LED devices is accuracy and reliability of component production. It is well known that increasing component yield reduces waste and decreases production time. However, as the size of LED devices shrink, it can become more difficult to maintain high yield levels. One approach to improved reliability is adaptive electrical pattern(s) (e.g., by routing) on LED devices. For example, when placing LEDs onto a substrate, there is some variability between ideal (i.e., theoretical) placement and actual placement due to machine tolerances. One known method of limited adaptive routing is through wire-bonding. It is possible for wire-bonding machines to recognize the die position and target the bond pads within a given range. However, this approach currently has drawbacks in that it is not made possible to adaptively change the wire shape, bonding direction, or target pad based on the die orientation. As such, there is an ongoing need for routing adaptability in LED device assembly. The adaptable routing apparatuses and methods described herein is not limited to LED devices, however; they can be applied to any electronic component construction where a component is placed on a substrate (or superstrate) and is electrically routed.

SUMMARY

Substrate-based or superstrate-based LEDs and related methods having improved reliability and performance are provided and described herein. Devices, components, and methods described herein can advantageously exhibit improved processing times, ease of manufacture, and/or lower processing costs. Devices, components, and related methods described herein are well suited for a variety of applications such as personal, industrial, and commercial lighting applications including, for example, light bulbs and light fixture products and/or applications. In some aspects, devices, components, and related methods described herein can comprise improved LED manufacturing processes and/or improved optical properties including improved light output, contrast, and more consistent and uniform light emission and color. Such devices can reduce costs and increase efficiency.

In one embodiment, a method for adaptively forming a pattern on an LED device is provided. Such a method comprises one or more of the following steps: attaching one or more electrical components to a base to form an LED device; capturing, using an optical device, an image (e.g., comprising positional data) showing actual positions and orientations of each of the electrical components attached to the LED device; transferring the image to a computing device, which comprises a processor and a memory; executing, using the processor, an adaptive routing algorithm stored in the memory to analyze the positional data; comparing the actual positions and orientations of each electrical component to reference design positions and orientations for each electrical component, wherein the reference design positions and orientations for each electrical component are stored in the memory; generating a customized pattern (e.g., a customized electrical routing pattern) based on a result of comparing the actual and reference design positions and orientations for each electrical component; transmitting the customized pattern to a pattern generating device; and forming, using the pattern generating device, electrically conductive features defined in the customized pattern to form a specified electrical circuit for the LED device.

In another embodiment, a method for adaptively routing a pattern on an LED device is provided. Such a method comprises one or more of the following steps: capturing, using a position sensing device, positional data of elements within the LED device; transferring the positional data to a computing device, which comprises a processor and a memory; executing, using the processor, an adaptive algorithm stored in the memory to analyze the data; producing a pattern based on the positional data; transmitting the pattern to a pattern generating device; and transferring the pattern onto the LED device.

In some embodiments of the methods disclosed herein, the pattern comprises electrically conductive features, which are either uniquely determined or chosen from a library based on a position of the elements such that a wire shape or a landing location is altered. In some such embodiments, the method comprises using a wirebonder to form at least one of the electrically conductive features. In some further such embodiments, the method comprises using a photo-imagable resist in subsequent processing to generate electrical traces. In some other such embodiments, the method comprises selectively removing electrically conductive material via laser ablation. In some embodiments of the methods disclosed herein, the pattern comprises one or more optical features. In some such embodiments, the method comprises using a photo-imagable resist in subsequent processing to generate the one or more optical features. In some other such embodiments, the method comprises using laser ablation to generate the one or more optical features.

In another embodiment, an adaptive routing system for creating an LED device is provided. Such an adaptive routing system comprises: an optical device for capturing one or more image of the LED device during construction; a computing device to analyze the captured image and generate a customized pattern (e.g., a customized electrical routing pattern) corresponding to the captured image; and a pattern generating device to form electrically conductive features to connect electrical components attached to a base of the LED device to form a specified electrical circuit on the LED device, wherein one or more of the electrical components are misplaced and/or misaligned with a reference design position and orientation for the specified electrical circuit, and wherein the electrically conductive features are adaptively formed by the pattern generating device based on a difference between the reference design position and orientation of each electrical component and an actual position and orientation of each electrical component.

In another embodiment, an adaptive routing system for creating an LED device is provided. Such an adaptive routing system comprises: a position sensing device for determining positional data of elements of the LED device during construction; a computing device to analyze the positional data and generate a customized pattern based on an actual position of the elements; and a pattern generating device for transferring the customized pattern to the LED device.

In some embodiments of the adaptive routing systems disclosed herein, the customized pattern comprises electrically conductive features, which are either uniquely determined or chosen from a library based on a position of the elements such that a wire shape or a landing location is altered. In some embodiments, the customized pattern comprises one or more of a customized electrical routing pattern, a customized chip mounting pattern, customized patterns having optical and/or reflective features, and/or customized positions for circuit elements, such as electrostatic discharge (ESD) devices. In some such embodiments, the system comprises a wirebonder for forming at least one of the electrically conductive features. In some further such embodiments, a photo-imagable resist is used (e.g., in subsequent processing) to generate electrical traces. In some other such embodiments, the system comprises a laser configured to selectively remove electrically conductive material via laser ablation. In some embodiments of the systems disclosed herein, the customizable electrical routing pattern comprises one or more optical features. In some such embodiments, a photo-imagable resist is used to form the one or more optical features. In some other such embodiments, the system comprises a laser configured to form the one or more optical features via laser ablation.

BRIEF DESCRIPTION OF THE DRAWINGS

A full and enabling disclosure of the present subject matter is set forth more particularly in the remainder of the specification, including reference to the accompanying exemplary figures, which relate to one or more example embodiments, in which.

DETAILED DESCRIPTION

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common cathode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, transparent or light-transmitting materials (e.g., glass, plastic, sapphire), and/or mounting elements of various materials and conformations arranged to receive, support, and/or conduct electrical power to solid state emitters. Electrical traces described herein provide electrical power to the emitters for electrically activating and illuminating the emitters. Electrical traces may be opaque or transparent, and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (with or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by dispensing, printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600, 175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted significantly by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the device upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862; and/or 4,918, 497, and U.S. Patent Application Publication Nos. 2009/ 0184616; 2009/0080185; 2009/0050908; 2009/0050907; 2008/0308825; 2008/0198112; 2008/0179611, 2008/ 0173884, 2008/0121921; 2008/0012036; 2007/0253209; 2007/0223219; 2007/0170447; 2007/0158668; 2007/ 0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device. A light-emitting apparatus as disclosed herein can further be used not only for illuminating an object or an area, but also for direct viewing of the apparatus (e.g., LED video displays).

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric or ceramic matrix) arranged to cover or partially cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties beyond 1000 hours or more at 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A gap between the LEDs and on the common substrate can extend to certain layers or can extend all the way to or from the common substrate. Therefore, a monolithic LED can comprise more than one LED junctions on a common substrate, and the gaps between the LEDs can be formed to at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In some embodiments, LEDs can be phosphor-converted red or green. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when a feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al2O3$), aluminum nitride (AlN), silicon carbide (SiC), silicon, or a plastic or polymeric material such as polyimide, polyester, epoxy, silicone, etc.

In some embodiments, LED (light emitting diode) devices and apparatuses are constructed in such a way that an electrical component, such as, for example, an LED chip, is placed on a substrate for electrical connection with other components to form a circuit. The placement of the electrical component can be either dependent on, or independent from, its intended electrical connection points. In some embodiments, an LED chip can be attached to the substrate at a first electrical connection, e.g., by soldering a contact pad of the LED chip to the first electrical connection. In some embodiments, an LED chip can be attached to the substrate using a non-conductive adhesive. Regardless of whether the LED chip is electrically and/or mechanically attached to the substrate, the electrical circuit is then subsequently defined by either creating one or more conductive features, which can include one or more of traces, wirebonds, leads, etc. between the LED chip and an electrical connection on the substrate and/or other components or using a removal process that removes unwanted connections or electrically conductive material. A typical LED chip is a two connection diode with a positive ("P") side and a negative ("N") side. LEDs can be constructed in a vertical, horizontal, or other manner, as described hereinabove.

In these types of devices, there may be some "static" electrical connections, such as solder pads, vias, electrical traces, etc., which are located on the surface of, within, or underneath the substrate and cannot be positionally adjusted depending on placement of an LED chip, while the positions of some other portions of the electrical circuit can be varied. The static connections can be, for example, located on the substrate. The variable portions can be a second electrical connection or portion thereof, which is formed after placement or attachment of the component. It is to be noted that both connections can be variable or static.

In some embodiments, the electrical components (also referred to herein as "element" or "elements") are adhesively attached to a superstrate, such that the electrical contacts of the electrical components are on an opposite side of the electrical chips from the superstrate. Such superstrates can be transparent, translucent, and/or opaque materials. In some such embodiments where one or more of the electrical components are LED chips and the superstrate is transparent and/or translucent, it is advantageous for the LED chips to have a light emitting surface arranged opposite the surface of the LED chips on which the electrical contact pads are arranged, such that the LED chips emit light through the superstrate with the electrical connections of the electrical circuit(s) being located in one or more plane behind the LED chips. In some other embodiments, the LED chips may be configured with light emitting surfaces on one or more of the lateral sides of the LED chip and/or on the same surface of the LED on which the electrical contact pads are arranged.

In an idealized LED device, the electrical component would be placed perfectly aligned with the design parameters, and the electrical connections of the electrical circuit(s) could be formed without the need for adaptive routing to allow for positional adjustment. However, due to existing precision limitations inherent to known electrical component placement systems, electrical components are normally aligned only within a prescribed tolerance of a specified position. In addition, further positioning errors can occur, such as rotating a component anywhere from −180° to 180° from the designated orientation of the electrical component at the specified position. It is therefore useful to have an electrical routing (e.g., pattern-forming) system that can dynamically adapt to a degree of random variability in the placement of electrical components by such placement systems. By using the adaptive routing techniques disclosed herein, unconventional die placement locations (e.g., having even greater displacements than can be accounted for using conventional techniques) can be used, which may have significantly decreased accuracy for die placement. Additionally, as die dimensions decrease (e.g., in devices utilizing micro LED devices), conventional die placement accuracy may not be sufficiently accurate for conventional electronic routing, thus it may be advantageous to implement the adaptive routing techniques disclosed herein to alleviate such limitations imposed by decreasing device dimensions.

Figure 1:
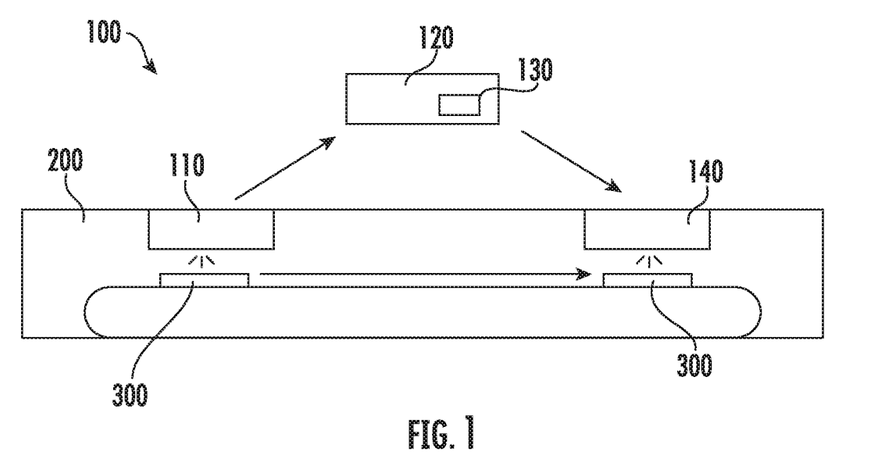
FIG. 1 is a schematic illustration of an example adaptive routing system for an LED device, according to the disclosure herein.

FIG. 1 shows an adaptive routing system, generally designated 100, configured for providing adaptive routing of electrical connections between one or more misaligned electrical components (e.g., light emitting diode, or LED, chips) and corresponding electrical sources. Adaptive routing system 100 can be included in a conventional LED production system 200 for producing an LED device 300. Adaptive routing system 100 includes an optical device 110, a computing device 120, an adaptive routing algorithm 130, and a pattern generating device 140. Optical device 110 captures at least one image (e.g., comprising positional data) of LED device 300 during at an intermediate production step thereof, prior to the formation of the electrical circuits that will connect the electrical components of LED device to the respective electrical sources. Optical device 110 is connected to computing device 120, such that optical device 110 is able to transmit the at least one image of LED device 300 to computing device 120. Computing device 120 has a processor and a memory and is configured to execute adaptive routing algorithm 130 when the at least one image of LED device 300 is received from optical device 110. Adaptive routing algorithm 130 comprises a set of computer-executable instructions for detecting a placement and rotational orientation of each electrical component on LED device 300, detecting a position of each of the electrical terminals on each electrical component, and generating a customized pattern (e.g., a customized electrical routing pattern) or, in some embodiments, choosing a best-match pattern from a library of such patterns, to connect the electrical terminals of each electrical component to a corresponding electrical source on LED device 300 according to an electrical circuit specified for LED device 300. The customized pattern can comprise, in some embodiments, one or more of a customized electrical routing pattern, a customized chip mounting pattern, customized patterns having optical and/or reflective features, and/or customized positions for circuit elements, such as electrostatic discharge (ESD) devices. The customized pattern is transmitted from the computing device 120 to the pattern generating device 140, which transfers the pattern to the LED device 300. In some embodiments, such as where wirebonding is utilized, the pattern generating device 140 completes the formation of the electrical circuit. In some other embodiments, only the pattern is transferred, such as is used for a photo-printing process. Then, a combination of subsequent processes, such as developing, etching, metal deposition, lift off, soldering, placing, positioning, etc. may be used to complete the task of creating the actual adaptive electrical connections. The electrically conductive features can comprise one or more wirebonds and/or one or more electrical traces.

In some embodiments, pattern generating device 140 comprises a laser configured to remove a portion of an electrical trace, especially in embodiments where one or more electrical traces are formed on a substrate prior to the placement of one or more of the electrical components. For example, in an embodiment where an electrical component is connected to a pre-formed electrical trace, it may be necessary to use a laser to trim an electrical discontinuity (e.g., a gap) into the pre-formed electrical trace to isolate the electrical contact of the electrical component from the pre-formed electrical trace.

In some embodiments, pattern generating device 140 is configured to apply electrically conductive features of the customized pattern to connect the trimmed portions of the pre-formed electrical traces to the designated electrical traces to form the specified electrical circuits for the LED device 300.

In some embodiments, optical device 110 is a digital camera. Optical device 110 can be located at several possible locations in production system 200, which is described in further detail below. In general, at least one optical device 110 is located at a point during the production of LED device 300 after one or more electrical components (see, e.g., LEDs 310, FIG. 3) have been placed or attached onto a substrate or base 320. In some embodiments, base 320 is a superstrate. Optical device 110 captures a view of LED device 300 that shows the orientation of the electrical components on LED device 300. This captured view can be, for example, a "top" or "bottom" view of the LED device 300 taken in a direction that shows any static electrical connections on base 320 (if present), as well as the P and/or N connections of the electrical components.

After optical device 110 transfers the captured image to computing device 120, adaptive routing algorithm 130 analyzes the captured image of LED device 300 in several different ways. In some embodiments, adaptive routing algorithm 130 compares the captured image to a reference (e.g., a stored image) of a specified (e.g., designated, theoretical, as designed, prescribed, perfectly aligned, ideal, etc.) placement of electrical components on base 320. In some such embodiments, adaptive routing algorithm 130 analyzes the captured image to determine the differences between the actual placement and orientation of each of the electrical components and the specified placement of the electrical components, this difference also being referred to as the misalignment of the electrical components. The misalignment is then used to adjust a previously determined pattern to create one or more customized routing features, or electrical connections, to connect the electrical components to electrical traces (e.g., traces 360, FIG. 3). For example, in some embodiments adaptive routing algorithm 130 can recognize a static pattern (or at least a portion thereof) and adaptively adjust a region of the routing to intersect with the static pattern, completing this portion of the electrical circuit for LED device 300.

In other embodiments, adaptive routing algorithm 130 can determine a routing pattern completely independently, without comparison to an ideal, or specified, set of electrical connections for the electrical circuit. In such embodiments, adaptive routing algorithm 130 can identify the conductive elements (e.g., 350, FIG. 3) to be connected as part of the electrical circuit and can determine an electrical routing pattern therefrom. Adaptive routing algorithm 130 can further take into account the wiring requirements for multiple electrical components, each of which may have various types of misalignment.

After adaptive routing algorithm 130 analyzes the positions and orientations of the electrical components and generates an adapted routing pattern, the routing pattern information is sent to pattern generating device 140. Pattern generating device 140 can be a single conventional LED processing device or a combination of several devices, depending on the type of routing features to be created and/or generated. For example, pattern generating device 140 can include devices for wirebonding, photochemical deposition, pattern exposure and developing, vacuum deposition, curing, plating, etching, silkscreening, laser removal, etc. In some embodiments, subsequent processing operations may be required to complete the pattern in the form of conductive elements; for example, pattern generating device 140 can be used to expose photo resist material placed on LED device 300, before and/or after the image was taken, then other operations may be used to develop, deposit, lift off, etc. a trace. Further examples of pattern generating device 140 are described in more detail below.

Figure 2:
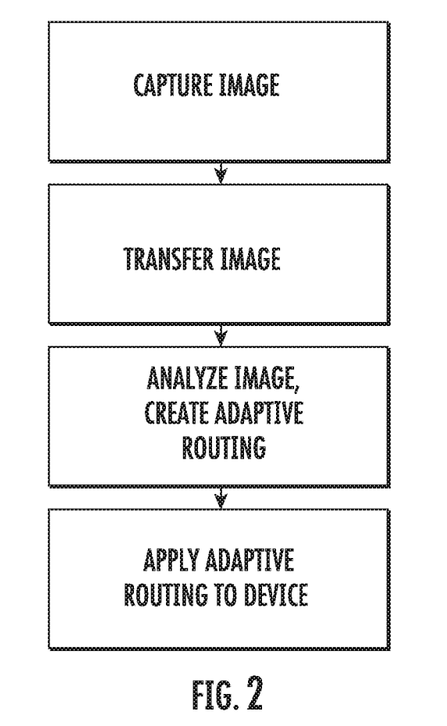
FIG. 2 is a flow chart for an example method of adaptively creating an electrical path for an LED device, according to the disclosure herein.

FIG. 2 is a flow chart describing a method of adaptively routing electrical contacts in an LED device. In a first step, optical device 110 captures an image of LED device 300 at a particular stage of the assembly thereof. As described hereinabove, LED device 300 can have irregularities in the placement of the electrical components thereof due to precision limitations in the manufacturing process. Next, the captured image is transferred (e.g., electronically) to computing device 120. Computing device 120 analyzes the captured image using adaptive routing algorithm 130 and creates an adaptive electrical routing pattern customized for the specific orientations of the electrical components detected on each specific LED device 300. The adaptive electrical routing pattern is then transferred to a pattern generating device 140, which then transfers the routing pattern (e.g., electrical connections) onto LED device 300. The steps shown in FIG. 2 can be arranged in a plurality of different combinations and, furthermore, one or more intermediate steps can be accomplished between one or more of the steps shown in FIG. 2.

Figure 3:
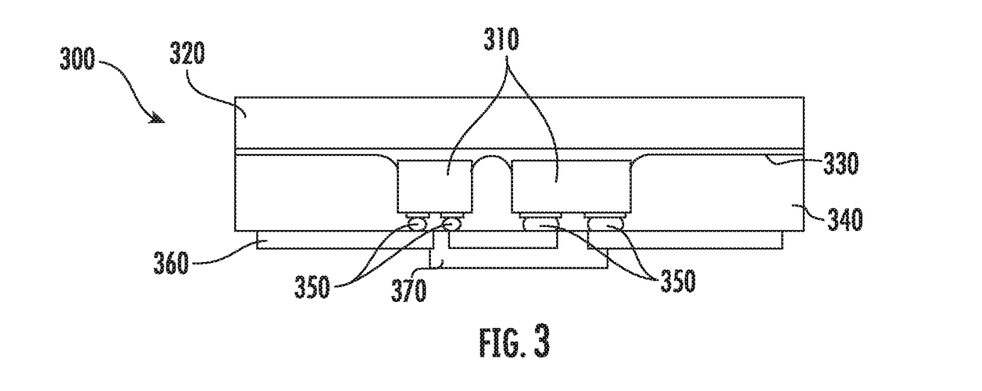
FIG. 3 is an example embodiment of an LED device formed by the adaptive routing system of FIG. 1, according to the disclosure herein.

FIG. 3 illustrates an example embodiment of an LED device 300 that can be formed using an adaptive routing system 100. As seen in the cross-sectional side view, LED device 300 includes a base 320, which is formed, for example, of a transparent or light-transmitting material. Although base 320 is depicted as an upper surface in FIG. 3, LED device 300 is constructed in this case using a "top-down" assembly technique; base 320 can therefore be referred to as a "superstrate" due to the fact that base 320 will be an upper or "top" surface of LED device 300 after assembly thereof. In the embodiment shown, one or more light emitting devices (e.g., LEDs) 310 are adhered to base 320 by making contact with and/or being pressed against an adhesive layer 330. As shown, the surface of LEDs 310 in contact with adhesive layer 330 is a light-emitting surface of LEDs 310. In some other embodiments, however, the lateral sides and/or the bottom side (e.g., the side on which the conductive elements 350 are arranged) of LEDs 310 may comprise light-emitting surfaces either in lieu of, or in addition to, the top surface of LEDs 310. After LEDs 310 are in contact with adhesive layer 330, electrically conductive elements 350, such as metal "bumps" or pads on a side of each LED component 310 away from die-attach layer 330, are deposited on the electrical contact pads of the LEDs 310 to create a raised electrically conductive contact area. These conductive elements 350 can be applied to LEDs 310 in a variety of conventional methods, such as wire bump bonding, solder bumping, plating, or other metallization techniques, which are provided by pattern generating device 140.

In some embodiments, LEDs 310 may have conductive elements 350 formed thereon prior to being affixed to adhesive layer 330. An encapsulant layer 340 is applied in liquid form around and between LEDs 310 to cover, either entirely or partially, the conductive elements 350. This encapsulant layer 340 is then cured and, in some embodiments where the conductive elements 350 are entirely encapsulated by encapsulant layer 340, a layer of encapsulant layer 340 is removed (e.g., mechanically) to create a substantially planar outer surface of encapsulant layer 340, with conductive elements 350 exposed and co-planar to the outer surface of the encapsulant layer. In some other embodiments, the conductive elements 350 may be recessed within an outer perimeter of encapsulant layer 340, but conductive elements 350 are nevertheless exposed such that further electrical connections to the LEDs 310 may be made.

Figure 4A:
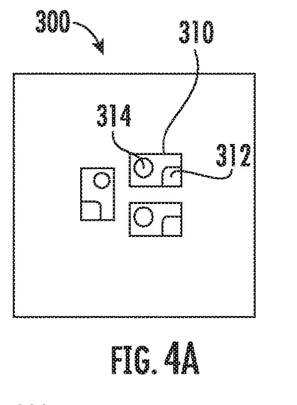
FIGS. 4A, 5A, and 6A show several stages of assembly of a first example embodiment of an LED device, as shown in FIG. 3, according to the disclosure herein.
Figure 4B:
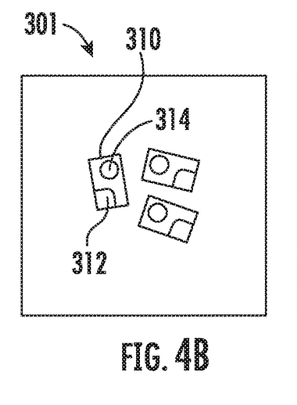
FIGS. 4B, 5B, and 6B show several stages of assembly of a second example embodiment of an LED device with the LED chips misaligned from the example embodiment shown in FIGS. 4A, 5A, and 6A, according to the disclosure herein.
Figure 4C:
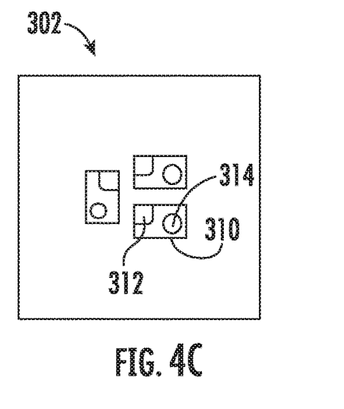
FIGS. 4C, 5C, and 6C show several stages of assembly of a third example embodiment of an LED device with the LED chips further misaligned from the example embodiment shown in FIGS. 4A, 5A, and 6A, according to the disclosure herein.
Figure 5A:
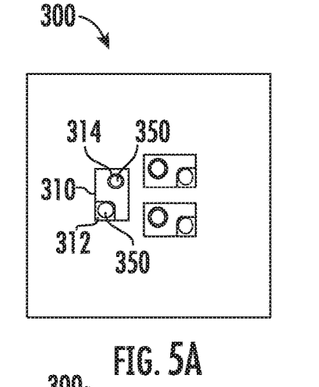

FIG. 4A is a view of the bottom surface of LED device 300 (as viewed in FIG. 3) showing a reference design placement of LEDs 310 prior to applying conductive elements 350. In the embodiment shown in FIG. 4A, LEDs 310 are arranged with the edges thereof being substantially parallel to the outer edges of the base (e.g., 320, FIG. 3) to which the LEDs 310 are attached and the group of LEDs are centered on LED device 300. However, the actual locations of each LED 310 on an LED device 300 can vary significantly due to translation and rotation of the parts during placement, resulting in an LED placement shown in FIG. 4B or 4C, which depict deviations in the placement of LEDs 310 on LED device 300 relative to the reference design placement shown in FIG. 4A. In the example "actual" cases, this imprecise placement and orientation of the LEDs 310 on LED device 300 introduces complexity in applying the electrically conductive elements 350, as well as the routing and formation of the electrically conductive traces 360. Such misalignments make it necessary to adjust the pattern which pattern generating device 140 generates to ultimately form a set of traces 360 that are electrically connected to the designated contact pads of the LEDs 310 according to the designated circuit being connected in LED device 300. Adaptive routing system 100 can be used to make this adjustment. Optical device 110 captures an image of the actual placement of LEDs 310 (see, e.g., FIG. 4B or 4C) and transfers the image to computing device 120. Computing device 120 executes adaptive routing algorithm 130 to analyze the placement and orientation information contained in the image to determine what, if any, modifications pattern generating device 140 needs to make to the reference design traces 360, shown in FIG. 6A, and the reference design locations for conductive elements 350, shown in FIG. 5A, such that the conductive elements 350 are in electrical contact with the contact pads of the LEDs 310.

Figure 5B:
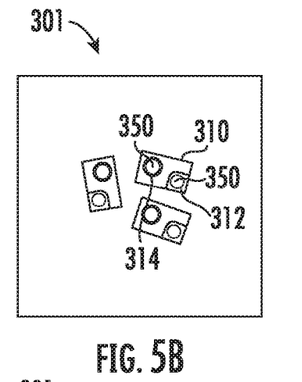
Figure 5C:
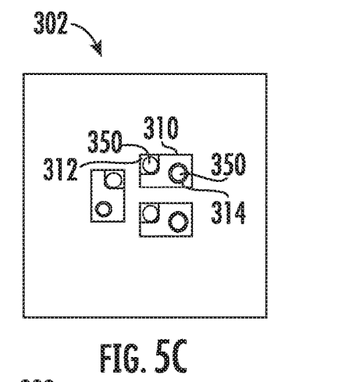

In some embodiments where the misalignment of the LEDs 310 is of a sufficiently small degree (e.g., ≤30°, ≤25°, ≤20°, ≤15°, ≤10°, ≤5°, ≤2°, or ≤1°) from the reference design orientation of LEDs 310, pattern generating device 140 is configured to form conductive elements 350 such that they are inclined, relative to a vertical line orthogonal to the upper surface of the LEDs 310, such that, at the position where each conductive element 350 will be present at the height where encapsulant layer 340 is to be trimmed, the conductive elements 350 will be located at the position specified in the reference design for the reference design traces 360. In some embodiments where the misplacement of the LEDs 310 is of a sufficiently small amount (e.g., less than or equal to a radius of the contact pad of the LED 310) from the reference design placement of LEDs 310, pattern generating device 140 is configured to form conductive elements 350 such that they are inclined, relative to a vertical line orthogonal to the upper surface of the LEDs 310, such that, at the position where each conductive element 350 will be present at the height where encapsulant layer 340 is to be trimmed, the conductive elements 350 will be located at the position specified in the reference design for the reference design traces 360. This inclined conductive element 350 can be, for example, an inclined solder "bump" or a wire. In some embodiments where one or more LEDs 310 are sufficiently misaligned and/or misplaced that it is not possible to sufficiently incline the conductive elements 350 to satisfy the reference design positions for the conductive elements 350, the shape of the traces 360 may also be adapted to ensure electrical connections between the proper traces 360 and the designated conductive elements 350. This can be seen in FIGS. 5A (reference design placement and orientation layout) and 5B and 5C (misaligned layout).

Figure 6A:
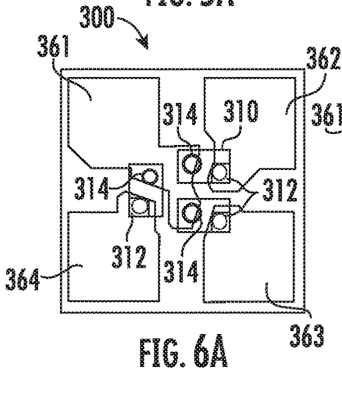
Figures 6B, 6C:
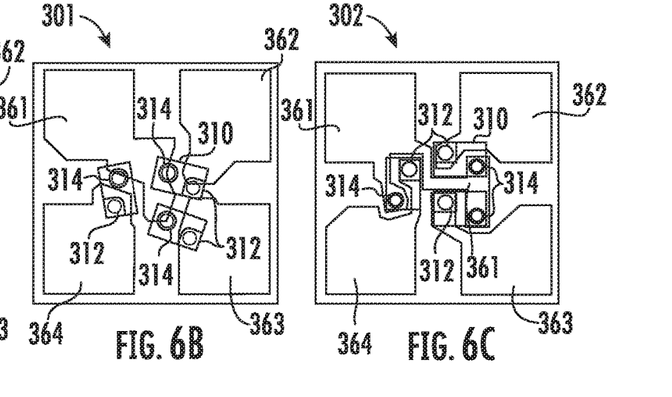

The conductive elements 350 are then connected by applying one or more layers of electrically conductive traces 360 over the conductive elements 350. FIG. 6A shows LED device 300 with metal traces 360 formed based on a reference design LED 310 placement and orientation. FIG. 6B shows LED device 300 with metal traces 360 applied to a set of modestly misaligned LEDs 310, the degree of such misalignment being such that electrical connectivity between the specified conductive elements 350 and the traces 360 can still be achieved without adapting the routing of the traces 360 from the reference design layout. FIG. 6C shows LED device 300 with metal traces 360 applied to a set of LEDs 310 which are misaligned by approximately 180° from that of the reference design placement and orientation for the LEDs 310. In this example embodiment, the degree of misalignment of the LEDs 310 is of such a degree that electrical connectivity between the specified conductive elements 350 and the traces 360 cannot be achieved without adapting the routing of the traces 360 from the reference design layout. As such, FIG. 6C shows how traces 360 are adapted such that the designated traces are at least partially in contact with the proper conductive elements 350 for each LED 310 of LED device 300. It can further be seen in FIGS. 6A-6C that the metal traces can be formed such that some variation is accounted for, i.e., the metal traces 360 need not be changed in some embodiments between the reference design and misaligned layouts.

In some embodiments of adaptive routing system 100, the dynamic adjustments can include, as shown in FIG. 6C, routing changes to metal traces 360. For example, an image of LED device 300, as depicted in FIG. 5C or 6C, from optical device 110 can be compared to a stored image of a metal trace 360 according to the reference design for LED device 300 using adaptive routing algorithm 130. In some embodiments, the image can be an image that particular LED device 300 at an upstream location during the manufacturing process. If LEDs 310 have been placed or oriented other than the position and orientation specified in the reference design position, but still within a zone of accommodation (see, e.g., R, FIG. 8) specified within the reference design, the layout of one or more traces 360 can be altered before being applied by pattern generating device 140. In some embodiments, an ablating device (not shown), such as a laser, can be used to "trim" the trace after its formation to create an electrical discontinuity when a trace is improperly connected to a non-designated conductive element 350 according to a circuit design for LED device 300. In some embodiments, adaptive routing algorithm 130 can direct the ablating device (e.g., the laser) to remove interfering portions of metal traces 360 after application. After this trimming function has been carried out, a secondary trace may be formed to connect the trimmed portion of the trace 360 to a proper trace 360. In a non-limiting example, optical device 110 captures an image of LED device 300 after the wire-bumping stage creates the conductive elements 350, and adaptive routing algorithm 130 creates a trace pattern to connect the conductive elements 350 of LEDs 310 to a region where at least a portion of metal traces 360 is co-located. Adaptive routing algorithm 130 can also direct a photoresistive exposure system (not shown) to add or remove portions of metal traces 360 to form a completed circuit.

In some embodiments, further manufacturing and/or assembly processes can be performed on LED device 300 after the adaptive routing process. For example, a solder mask (see, e.g., 370, FIG. 3) can be disposed at least partially over one or more of the layers of traces 350.

Figure 7A:
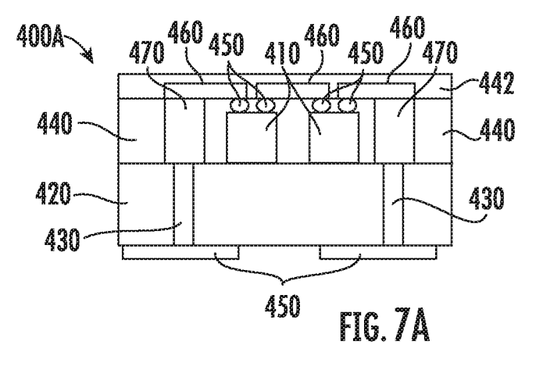
FIG. 7A is a sectional view of an example embodiment of an LED device without electrical contacts being arranged thereon, according to the disclosure herein.
Figure 7B:
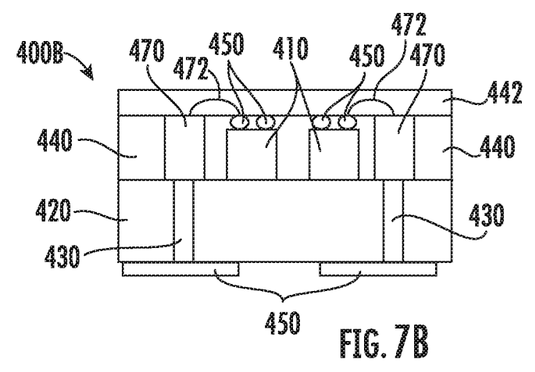
FIGS. 7B and 7C are sectional views of example embodiments of an LED device using wirebonds for the adaptive routing, according to the disclosure herein.
Figure 7C:
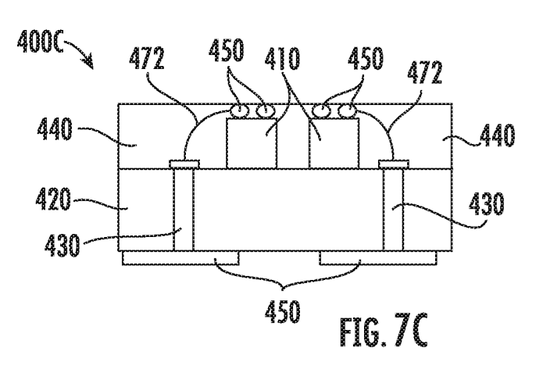

FIGS. 7A-7C illustrate several example embodiments of an LED device, which are created using adaptive routing system shown in FIG. 1. LED devices, which are generally designated 400A, 400B, and 400B in FIGS. 7A, 7B, and 7C, respectively, have LEDs 410 mounted and/or attached on a base 420. In the example embodiments shown in FIGS. 7A-7C, base 420 is a substrate with vias 430 formed through a thickness thereof, and LEDs 410 have a die that is arranged on a top side of LED 410, such that the electrical contact pads of the LEDs 410 are disposed on a top surface thereof, opposite that of the base 420. LEDs 410 output light from this top surface and/or a lateral surface of LED 410. Vias 430 extend through base 420 to a lower surface of base 420, wherein they are electrically connected to solder pads 450, which can be connected to an external power source to energize the LEDs 410 of LED device 400.

An encapsulant layer 440 is applied around and between LEDs 410. In some embodiments, encapsulant layer 440 can be omitted either partially or entirely. Encapsulant layer 440 can be provided as a planarized (i.e., flat or uniformly thick) surface for depositing metal traces 460 thereon, or wire bonds 472 thereover. Via landing pads 470 can also be built up on the top surface of base 420 to be substantially a same height as, or higher than, LEDs 410. In some embodiments, via landing pads 470 can be produced at a height above a finished height of encapsulant layer 440 after the encapsulant layer 440 has been planarized. Alternately, encapsulant layer 440 can be reduced or omitted and via landings 470 can have a top surface below the height of the LEDs 410. In some embodiments, via landing pads 470 can be in a form of a wire that is electrically connected to one of the vias 430, such wire being capable of being shaped such that it has a curved profile. Such embodiments having a wire for one or more via landing pads 470 can thus provide electrical connection points on the planarized surface of the encapsulant layer 440 that are laterally displaced from a position directly above the via 430 to which is it attached. In the embodiment shown in FIG. 7A, traces 460 can be formed on the planarized surface of the encapsulant layer 440 to provide an electrical connection between the electrical contact pads of one or more LEDs 410 and the solder pads 450. In the embodiment of FIG. 7B, wirebonds 472 are used to connect the conductive elements 450 of one or more LEDs 410 and the via landing pads 470. In some such embodiments, it may be advantageous to provide a secondary layer of encapsulant material 442 to protect wirebonds 472 or traces 460 and reduce the fragility of LED device 400. In the embodiment of FIG. 7C, the via landing pads 470 are formed at a height lower than the upper surface of the LEDs 410. In some embodiments, via landing pads 470 may be formed as a metallic trace. In some other embodiments, via landing pads 470 may be formed in substantially a same manner as the conductive elements 450 on LEDs 410. In this embodiment, wirebonds 472 are electrically connected between via landing pads 470 and the conductive elements 450 of one or more LEDs 410. After the wirebonds 472 are connected, the encapsulant layer 440 may be dispensed and, in some such embodiments, planarized to provide a substantially smooth (e.g., flat) surface. In some embodiments, "built up" via landing pads 470 may be provided and wirebonds 472 may be soldered to the lateral sides thereof, with the top surface of the via landing pads 470 being configured for electrical connection with at least one LED 410 using traces, which may be adaptively routed.

Figure 8:
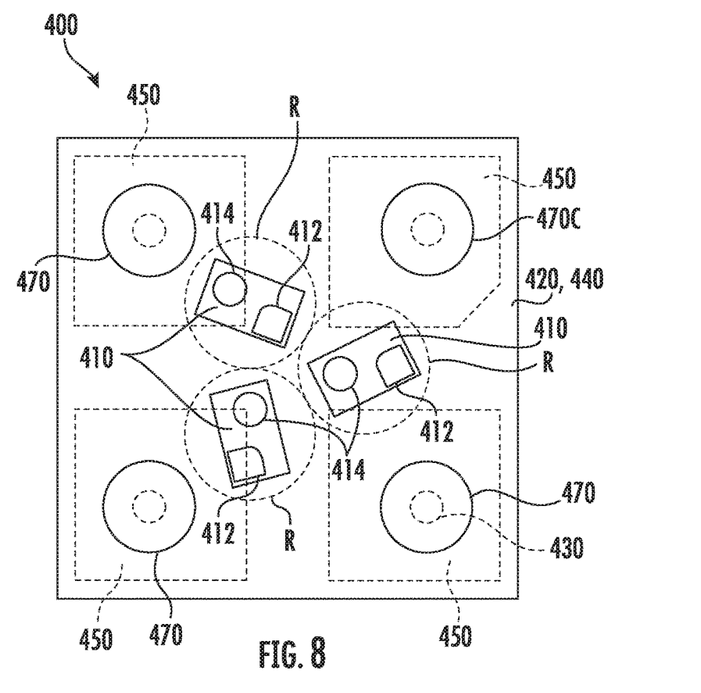
FIG. 8 is a top view of an example embodiment of the LED device of FIG. 7A before electrical traces are adaptively created, according to the disclosure herein.

FIG. 8 is a top view of FIG. 7A, illustrating a possible placement of LEDs 410 on base 420. In this example embodiment, the positive electrical contact pads of LEDs 410 are marked as 414 and are to be connected to a common via landing 470C, while the negative electrical contact pads are marked as 412 and are to be connected to three separate, and in some embodiments electrically independent, via landing pads 470, each of which are in electrical connection with a corresponding via 430. The designation of 412 and 414 as being "negative" and "positive" is merely for convenience and can be altered readily by those skilled in the art. Tolerance regions R designate a position on base 420 for the placement of each LED 410. Because the LEDs 410 can be located at any position and orientation within region R, electrical routing between LEDs 410 and via landing pads 470 and 470C will often require modifications, using an adaptive routing algorithm (130, FIG. 1) and a pattern generating device (140, FIG. 1). An adaptive routing system (100, FIG. 1) can be used to capture an image of LED device 400 at a stage of production prior to, for example, applying conductive elements 450 to LEDs 410, dispensing encapsulant layer 440, forming via landing pads 470, 470C, and/or generating the adaptive routing, which can comprise at least one trace 460 and/or at least one wirebond 472 for the designated electrical circuit.

Figure 9:
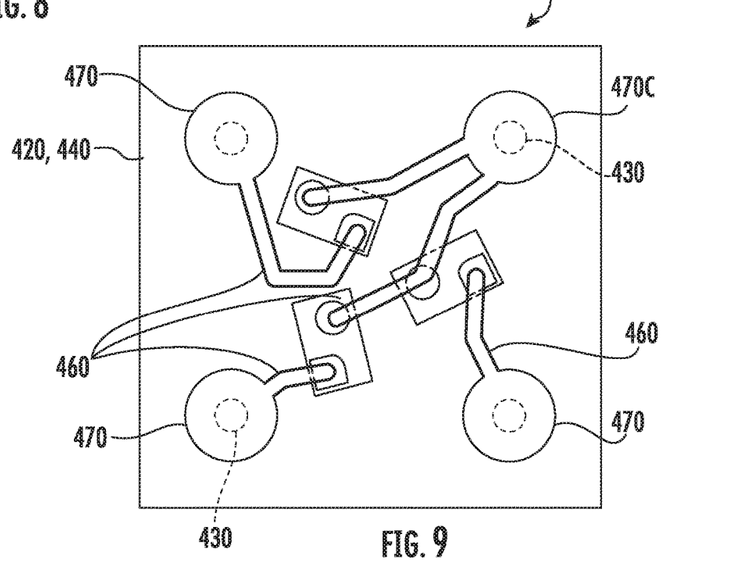
FIG. 9 is a top view of the LED device of FIG. 8, showing an example adaptive routing of electrical traces, according to the disclosure herein.
Figure 10A:
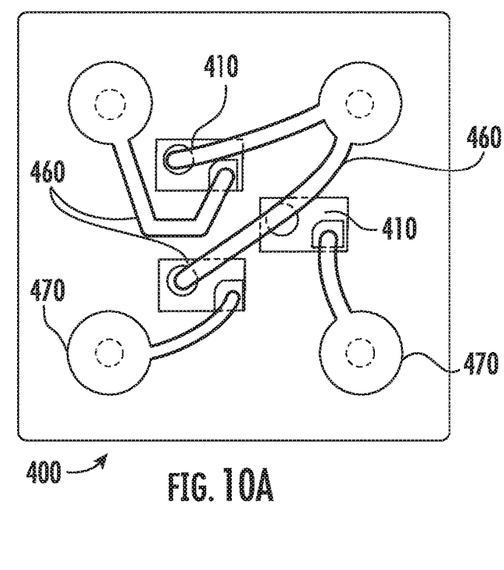
FIGS. 10A through 10H show example embodiments adaptive routing patterns for use in LED devices having a plurality of LED chip orientations, according to the disclosure herein.
Figure 10B:
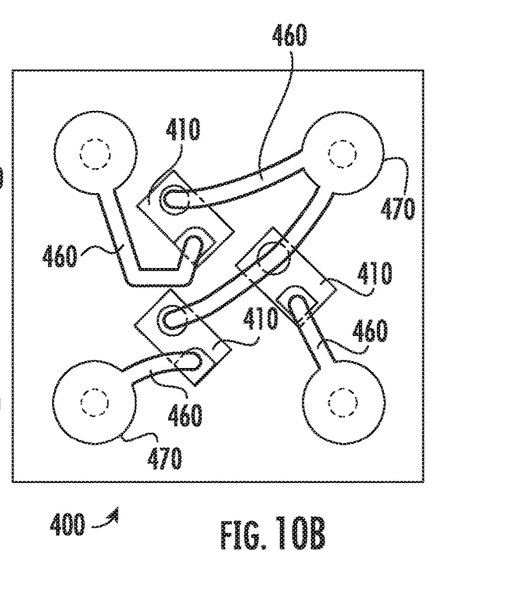
Figure 10C:
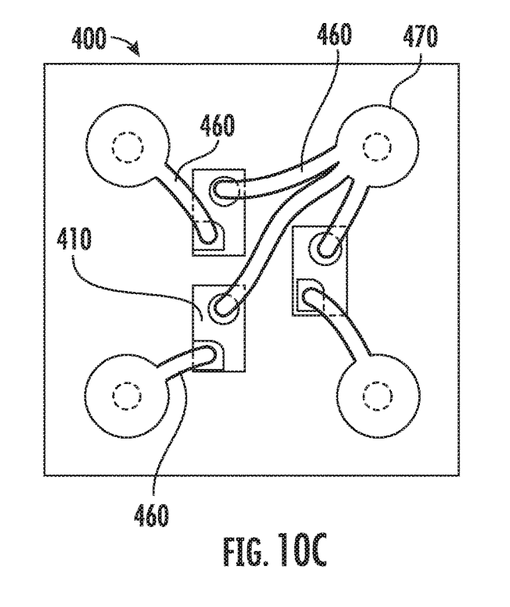
Figure 10D:
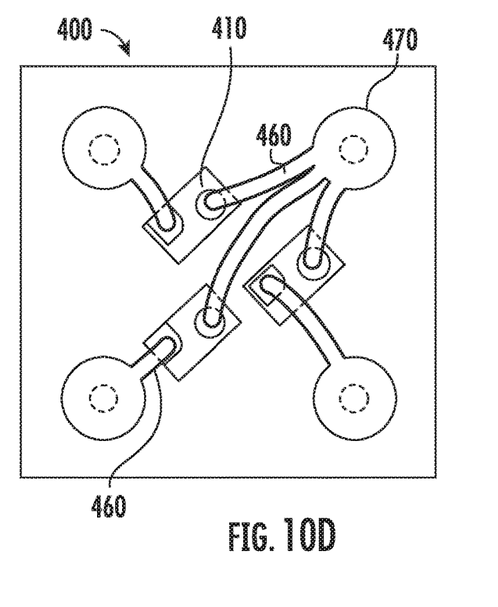
Figure 10E:
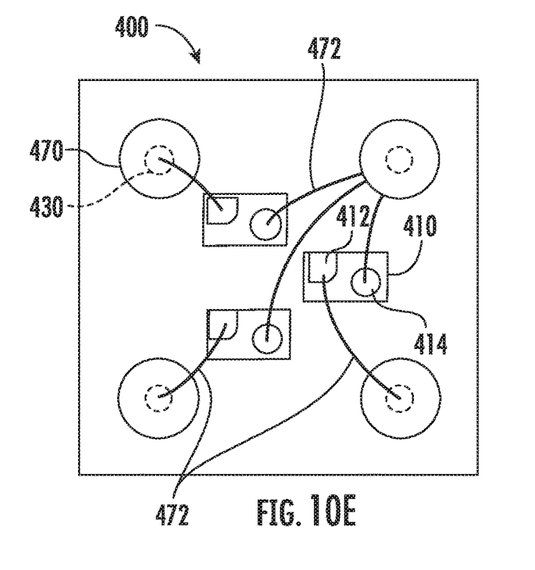
Figure 10F:
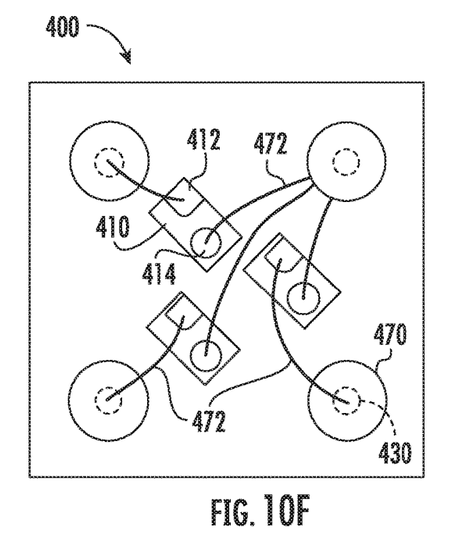
Figure 10G:
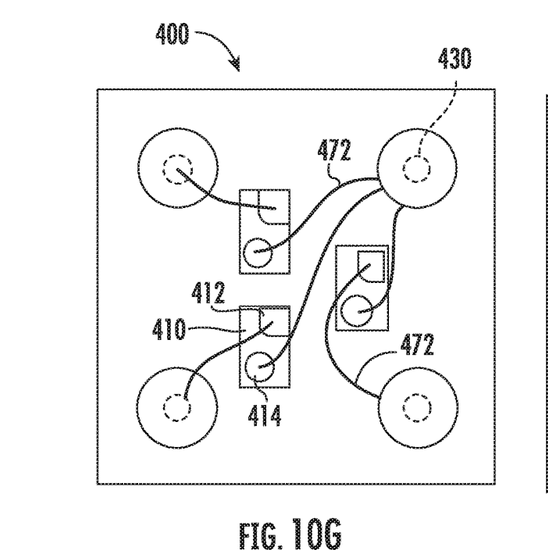
Figure 10H:
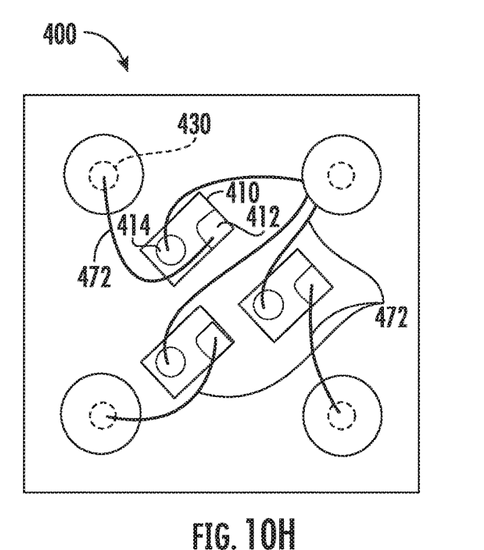

For example, FIG. 9 shows LED device 400 after traces 460 have been created in an adaptively routed pattern to interconnect each of the electrical contact pads of each LED 410 with the designated via landing pads 470, the adaptively routed pattern having been generated by adaptive routing algorithm 130 and applied to LED device 400 using pattern generating device 140. As illustrated, traces 460 connect each LED 410 to a via landing pad 470 specified in the reference image for the electrical circuit being formed in LED device 400 without interfering with, or contacting, one another, except for where traces 460 share a common via landing pad 470.

Further examples of adapted routing patterns are given in FIGS. 10A-10H. FIGS. 10A-10D are similar to FIG. 9 and show of various orientations of LEDs 410 that can be connected in the specified electrical circuit using traces 460 generated by adaptive routing system 100. FIGS. 10E-10H are also examples of adaptive routing using wire bonds 472 to connect LEDs 410 to the via landing pads 470 designated by the electrical circuit being created. In these examples embodiments, encapsulant layer 440 can be reduced in height, partially absent or removed, or omitted entirely.

Although the embodiments described herein are directed toward multi-color arrays of LEDs, it is to be understood that the methods and devices can also be applied to single LEDs and single-color arrays.

The subject matter disclosed herein can be implemented in software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that, when executed by a processor of a computer, control the hardware to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. The methods and systems disclosed and described hereinabove can be applied to adaptively form other features/aspects of electrical devices as well. For example, some such electrical devices may have a micro lens structure formed over one or more LED chips on such electrical devices, these micro lens structures being used to adjust the emission pattern (e.g., far field or near field) from the electrical device. Continuing with this example, such adaptive techniques and systems for implementing such adaptive techniques, as disclosed hereinabove, can be used to adapt the shape, profile, etc. of the micro lens structure to follow the position of the LED chip(s) or otherwise adapt the micro lens structure to generate a specified optical emission pattern, thereby accounting for any misalignment and/or misplacement of such LED chip(s).

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A method for adaptively forming a pattern on a light emitting device, the method comprising:
    providing a base, which comprises a light-transmissive material;
    providing an adhesive layer on a surface of the base;
    pressing a light emitting surface of the light emitting diodes (LEDs) against the adhesive layer to secure the LEDs to the base, such that the light emitting surface of the LEDs faces the adhesive layer;
    capturing, using a position sensing device, positional data of the LEDs on the base of the light emitting device;
    transferring the positional data to a computing device, which comprises a processor and a memory;
    executing, using the processor, an adaptive algorithm stored in the memory to analyze the positional data of the LEDs on the base;
    producing a pattern based on the positional data;
    transmitting the pattern to a pattern generating device; and
    transferring the pattern onto the light emitting device.

2. The method of claim 1, wherein the pattern ultimately comprises electrically conductive features.

3. The method of claim 2, wherein forming the electrically conductive features comprises one or more of wirebonding, photochemical deposition, pattern exposure and developing, vacuum deposition, curing, plating, etching, and/or silkscreening.

4. The method of claim 2, comprising using a wirebonder to form at least one of the electrically conductive features, which are either uniquely determined or chosen from a library based on a position of the LEDs such that a wire shape or a landing location is altered.

5. The method of claim 1, comprising using a photo-imageable resist in subsequent processing to generate the pattern.

6. The method of claim 1, comprising selectively removing electrically conductive material via laser ablation.

7. The method of claim 1, wherein the pattern ultimately comprises one or more optical features.

8. The method of claim 1, wherein the positional data comprises actual positions and orientations of each of the LEDs attached to the base of the light emitting device, the method comprising comparing the actual positions and orientations of each LED to reference design positions and orientations for each LED, wherein comparing the actual and reference design positions and orientations for each LED comprises:
    recognizing conductive elements on each LED and/or on the base of the light emitting device; and
    determining a routing path using prescribed routing rules.

9. The method of claim 1, comprising:
    applying electrically conductive elements to the LEDs, either before or after the LEDs are attached to the base; and
    dispensing an encapsulant layer over the base and around the LEDs of the light emitting device.

10. The method of claim 9, comprising:
    planarizing the encapsulant layer to form a substantially flat top surface of the encapsulant layer and/or expose the electrically conductive elements; and
    depositing electrically conductive traces over the encapsulant layer using an adaptive approach, based on a respective position of each of the electrically conductive elements in the top surface of the encapsulant layer.

11. The method of claim 1, comprising:
    applying electrically conductive elements to a surface of the LEDs that is opposite the light emitting surface, either before or after the LEDs are attached to the base; and
    dispensing an encapsulant layer over the base and around the LEDs of the light emitting device.

12. A method for adaptively forming a pattern on a light emitting device, the method comprising:
    providing a base, which comprises a light-transmissive material;
    providing an adhesive layer on a surface of the base;
    pressing light emitting diodes (LEDs) against the adhesive layer to secure the LEDs to the base;
    capturing, using a position sensing device, positional data of the LEDs on the base of the light emitting device;
    transferring the positional data to a computing device, which comprises a processor and a memory;
    executing, using the processor, an adaptive algorithm stored in the memory to analyze the positional data of the LEDs on the base;
    producing a pattern based on the positional data;
    transmitting the pattern to a pattern generating device;
    transferring the pattern onto the light emitting device;
    applying electrically conductive elements to the LEDs, either before or after the LEDs are attached to the base;
    dispensing an encapsulant layer over the base and around the LEDs of the light emitting device;
    planarizing the encapsulant layer to form a substantially flat top surface of the encapsulant layer and/or expose the electrically conductive elements; and
    depositing electrically conductive traces over the encapsulant layer using an adaptive approach, based on a respective position of each of the electrically conductive elements in the top surface of the encapsulant layer.

* * * * *